United States Patent
Jeong et al.

(10) Patent No.: US 9,660,669 B2
(45) Date of Patent: May 23, 2017

(54) ENCODING APPARATUS AND ENCODING METHOD THEREOF

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Hong-sil Jeong, Suwon-si (KR); Sang-hyo Kim, Seoul (KR); Kyung-joong Kim, Suwon-si (KR); Se-ho Myung, Yongin-si (KR); Jong-hwan Kim, Suwon-si (KR); Dae-hyun Ryu, Seongnam-si (KR); Min Jang, Seoul (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 184 days.

(21) Appl. No.: 14/580,514

(22) Filed: Dec. 23, 2014

(65) Prior Publication Data
US 2015/0333767 A1  Nov. 19, 2015

(30) Foreign Application Priority Data
May 15, 2014 (KR) ........................ 10-2014-0058333

(51) Int. Cl.
*H03M 13/11* (2006.01)
*H03M 13/00* (2006.01)

(52) U.S. Cl.
CPC ... *H03M 13/6502* (2013.01); *H03M 13/1148* (2013.01); *H03M 13/1154* (2013.01);
(Continued)

(58) Field of Classification Search
CPC .......... H03M 13/1102–13/1197; H03M 13/61; H03M 13/615; H03M 13/616;
(Continued)

(56) References Cited

U.S. PATENT DOCUMENTS

| | | | | |
|---|---|---|---|---|
| 2010/0088573 A1* | 4/2010 | Lakkis | .............. | H03M 13/6393 714/758 |
| 2011/0131463 A1* | 6/2011 | Gunnam | ................. | G06F 17/16 714/752 |
| 2011/0154168 A1* | 6/2011 | Lee | ...................... | H03M 13/116 714/801 |

\* cited by examiner

*Primary Examiner* — Albert Decady
*Assistant Examiner* — Christian Dorman
(74) *Attorney, Agent, or Firm* — Sughrue Mion, PLLC (57) ABSTRACT

An encoding apparatus which performs encoding such as Low Density Parity Check (LDPC) encoding is provided. The encoding apparatus includes: an encoder encoding input bits using a parity check matrix including a plurality of blocks, each being formed of a first information word sub-matrix and a first parity sub-matrix arranged next to each other, and a second information sub-matrix and a second parity sub-matrix arranged next to each other; a bit determiner determining a value of a last sub-parity bit among sub-parity bits generated by encoding the input bits with respect to a first block among the plurality of blocks; and a bit modifier reversing values of bits generated by encoding the input bits with respect to a second block next to the first block based on the value of the last parity bit among the sub-parity bits generated by the encoding with respect to the first block.

10 Claims, 11 Drawing Sheets

(52) U.S. Cl.
CPC .... *H03M 13/1197* (2013.01); *H03M 13/1102* (2013.01); *H03M 13/611* (2013.01); *H03M 13/616* (2013.01)

(58) Field of Classification Search
CPC ... H03M 13/617; H03M 13/611; G06F 11/10; G06F 11/1004
See application file for complete search history.

$$H = \begin{bmatrix} H_0(0) & & & & \\ H_1(1) & H_0(1) & & & \\ H_2(2) & H_1(2) & H_0(2) & & \\ & H_2(3) & H_1(3) & H_0(3) & \\ & & H_2(4) & H_1(4) & H_0(4) \\ & & & & \ddots \end{bmatrix} \quad H = \begin{bmatrix} 01 & & & & \\ 00 & & & & \\ 00 & & & & \\ 10 & 01 & & & \\ 01 & 00 & & & \\ 10 & 00 & & & \\ 10 & 10 & 01 & & \\ 11 & 01 & 00 & & \\ 01 & 10 & 00 & & \\ & 10 & 10 & 01 & \\ & 11 & 01 & 00 & \\ & 01 & 10 & 00 & \\ & & 10 & 10 & 01 \\ & & 11 & 01 & 00 \\ & & 01 & 10 & 00 \\ & & & 10 & 10 \\ & & & 11 & 01 \\ & & & 01 & 10 & \ddots \end{bmatrix}$$

ENCODING APPARATUS AND ENCODING METHOD THEREOF

CROSS-REFERENCE TO THE RELATED APPLICATION

This application claims priority from Korean Patent Application No. 10-2014-0058333, filed on May 15, 2014 in the Korean Intellectual Property Office, the disclosure of which is incorporated herein by reference in its entirety.

BACKGROUND

1. Field

Apparatuses and methods consistent with exemplary embodiments relate to Low Density Parity Check (LDPC) encoding.

2. Description of the Related Art

The Spatially Coupled Low Density Parity Check (SC-LDPC) code has an advantage of being able to support parallel decoding by applying a pipeline structure at a decoder. Accordingly, a codeword having a length which cannot be processed by the existing SC-LDPC encoding method may be considered.

Meanwhile, one of main features of the LDPC code is that the performance is improved as a length of a codeword becomes longer, when a parity check matrix has the same matrix structure. Accordingly, it is advantageous to use a long LDPC codeword in terms of the performance, if possible.

A maximum length of an LDPC codeword which has been used in a common communication and broadcasting system is 64,800 bits. However, in case of the SC-LDPC code, it is possible to decode a codeword having a much longer bit length with realistic complexity. Accordingly, the SC-LDPC code may be designed as a parity check matrix which is larger than the existing LDPC code.

Meanwhile, as a length of a codeword becomes longer, the complexity of an encoder increases. In order to resolve this problem, a codeword having an Irregular Repeat Accumulate (IRA) structure may be used.

However, a Spatially Coupled Irregular Repeat Accumulate (SC-IRA) code also has a problem that the encoding complexity increases linearly as a length of a codeword becomes longer. Accordingly, there is a need for a method of decreasing the encoding complexity of the SC-IRA code.

SUMMARY

Various exemplary embodiments are provided to address the aforementioned and other problems and disadvantages occurring in the related art. The exemplary embodiments provide an encoding apparatus and method which perform an encoding operation in parallel in order to decrease the encoding complexity even though a length of a codeword becomes longer.

According to an aspect of an exemplary embodiment, there is provided an encoding apparatus which may include: an encoder configured to perform encoding input bits using a parity check matrix including a plurality of blocks each of which is formed of a first information word sub-matrix and a first parity sub-matrix arranged on the immediate right of the first information word sub-matrix, and a second information sub-matrix and a second parity sub-matrix arranged on the immediate right of the second information sub-matrix; a bit determiner configured to determine a value of a last sub-parity bit among sub-parity bits generated by encoding the input bits at the encoder with respect to a first block among the plurality of blocks; and a bit modifier configured to reverse values of bits generated by encoding the input bits at the encoder with respect to a second block next to the first block based on the value of the last parity bit among the sub-parity bits generated by the encoding with respect to the first block. Here, the encoder may be further configured to change a value of an element of the second parity sub-matrix prior to generating the sub-parity bits with respect to the first block.

In this case, the bit determiner may determine a value of a last sub-parity bit among sub-parity bits generated by encoding the input bits at the encoder with respect to the second block after reversing the values of the bits generated by the encoding with respect to the second block. In addition, the bit modifier may reverse values of bits generated by encoding the input bits at the encoder with respect to a third block next to the second block based on the value of the last sub-parity bit among the sub-parity bits generated by the encoding with respect to the second block.

The first parity sub-matrix may have a dual diagonal structure, and the second parity sub-matrix may have a first row in which 1 exists in a last column and 0 exists in the other columns.

In this case, the encoder may change a value of a last column of the first row of the second parity sub-matrix to 0.

In response to the last sub-parity bit among the sub-parity bits generated by the encoding with respect to the first block being determined as 1, the bit modifier may reverse the values of the bits generated by the encoding with respect to the second block.

According to an aspect of another exemplary embodiment, there is provided an encoding method which may include: encoding input bits using a parity check matrix comprising a plurality of blocks each of which is formed of a first information word sub-matrix and a first parity sub-matrix arranged on the immediate right of the first information word sub-matrix, and a second information sub-matrix and a second parity sub-matrix arranged on the immediate right of the second information sub-matrix; determining a value of a last sub-parity bit among sub-parity bits generated by encoding the input bits with respect to a first block among the plurality of blocks; and reversing values of bits generated by encoding the input bits with respect to a second block next to the first block based on the value of the last parity bit among the sub-parity bits generated by the encoding with respect to the first block. Here, prior to generating the sub-parity bits with respect to the first block, a value of an element of the second parity sub-matrix may be changed.

In this case, the determining may include determining a value of a last sub-parity bit among sub-parity bits generated by encoding the input bits with respect to the second block after reversing the values of the bits generated by the encoding with respect to the second block. In addition, the reversing may include reversing values of bits generated by encoding the input bits with respect to a third block next to the second block based on the value of the last sub-parity bit among the sub-parity bits generated by the encoding with respect to the second block.

The first parity sub-matrix may have a dual diagonal structure, and the second parity sub-matrix may have a first row in which 1 exists in a last column and 0 exists in the other columns.

In this case, the value of the element of the second parity sub-matrix may be changed by changing a value of a last column of the first row of the second parity sub-matrix to 0.

Meanwhile, in response to the last sub-parity bit among the sub-parity bits generated by the encoding with respect to the first block being determined as 1, the reversing may include reversing the values of the bits generated by the encoding with respect to the second block.

According to the above various exemplary embodiments, it is possible to perform an encoding operation of an SC-IRA code in parallel, and thus, a code having a long length may be processed at high speed.

BRIEF DESCRIPTION OF THE DRAWINGS

The above and/or other aspects of the inventive concept will be more apparent by describing certain exemplary embodiments of the inventive concept with reference to the accompanying drawings, in which.

DETAILED DESCRIPTION OF THE EXEMPLARY EMBODIMENT

Certain exemplary embodiments are described in greater detail below with reference to the accompanying drawings.

In the following description, like drawing reference numerals are used for the like elements, even in different drawings. The matters defined in the description, such as detailed construction and elements, are provided to assist in a comprehensive understanding of exemplary embodiments. However, different exemplary embodiments can be practiced without those specifically defined matters. Also, well-known functions or constructions are not described in detail since they would obscure the exemplary embodiments described herein with unnecessary detail.

Figure 1:
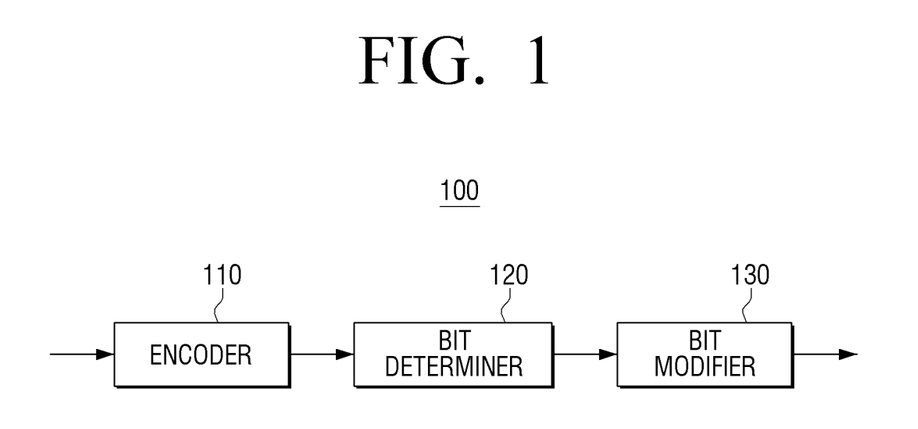
FIG. 1 is a block diagram provided to describe a structure of an encoding apparatus according to an exemplary embodiment.

FIG. 1 is a block diagram provided to describe a structure of an encoding apparatus according to an exemplary embodiment. According to FIG. 1, an encoding apparatus 100 includes an encoder 110, a bit determiner 120, and a bit modifier 130.

The encoder 110 performs a Low Density Parity Check (LDPC) encoding operation with respect to input bits.

To be specific, the encoder 110 may perform the LDPC encoding operation on input bits using a parity check matrix so that the input bits are encoded as information word bits to generate a codeword, that is, an LDPC codeword.

In this case, the codeword may include information word bits and parity bits. For example, the encoder 110 may perform an LDPC encoding operation with respect to the information word bits ($I=(i_1, i_2, \ldots, i_k)$) formed of k bits and generate parity bits ($P=(p_1, p_2, \ldots, p_{n-k})$) formed of n–k bits.

According, a codeword ($C=(c_1, c_2, \ldots, c_n)=(i_1, i_2, \ldots, i_k, p_1, p_2, \ldots, p_{n-k})$) formed of n bits may be generated.

For the above operation, the encoder 110 may store information on the parity check matrix which is used in the LDPC encoding operation.

Meanwhile, an LDPC code processed by the encoder 110 is a Spatially Coupled Low Density Parity Check (SC-LDPC) code, more particularly, an LDPC code in a Spatially Coupled Irregular Repeat Accumulate (SC-IRA) structure. Accordingly, a parity check matrix used for the SC-LDPC code is described below.

Figure 2:
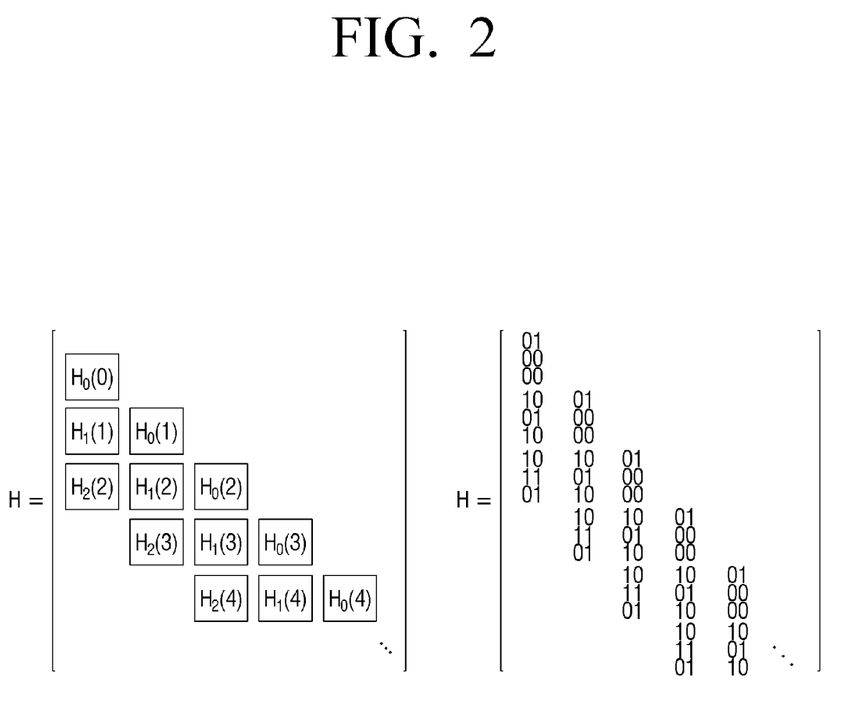
FIG. 2 is a diagram provided to describe a structure of a parity check matrix of an SC-LDPC code.

In case of the SC-LDPC code, a parity check matrix has a spatially coupled structure as in FIG. 2.

Referring to FIG. 2, a left drawing shows a structure of a parity check matrix which is used for the SC-LDPC code, and a right drawing shows a specific example of the parity check matrix which satisfies a structure of the left drawing.

To be specific, the parity check matrix of the SC-LDPC code includes a plurality of sub-matrixes, and each of the plurality of sub-matrixes may be arranged repeatedly in the parity check matrix while being shifted by a predetermined number of rows in a column direction.

For example, as shown in FIG. 2, a parity check matrix H may include sub-matrixes $H_0, H_1, H_2, \ldots$, and each of the sub-matrixes may be arranged repeatedly in the parity check matrix H while being shifted by a predetermined number of rows in a column direction.

That is, the parity check matrix H may be configured such that a sub-matrix $H_0(0)$ is arranged, a sub-matrix $H_1(1)$ is arranged immediately below the sub-matrix $H_0(0)$, and a sub-matrix $H_0(1)$ is arranged on the immediate right of the sub-matrix $H_1(1)$. In addition, in the parity check matrix H, a sub-matrix $H_2(2)$ and a sub-matrix $H_1(2)$ are arranged immediately below the sub-matrix $H_1(1)$ and the sub-matrix $H_0(1)$, respectively, and a sub-matrix $H_0(2)$ may be arranged on the immediate right of the sub-matrix $H_1(2)$. In addition, In the parity check matrix H, a sub-matrix $H_2(3)$ and a sub-matrix $H_1(3)$ are arranged immediately below the sub-matrix $H_1(2)$ and the sub-matrix $H_0(2)$, respectively, and a sub-matrix $H_0(3)$ is arranged on the immediate right of the sub-matrix $H_1(3)$.

In other words, the parity check matrix H may be configured such that a sub-matrix shifts down by the number of rows constituting the sub-matrix while shifting right by the number of columns constituting the sub-matrix, and this pattern applies to other sub matrixes. Overall, the parity check matrix H may take a form in which the sub-matrixes are shifted in a diagonal direction from an upper-left corner to a lower-right corner.

Meanwhile, a parity check matrix for an SC-LDPC code is formed of an information word sub-matrix and a parity sub-matrix as will be discussed below in reference to FIG. 3. Here, the parity sub-matrix may have a dual diagonal structure. In this case, the parity sub-matrix may be formed of columns corresponding to parity bits of a codeword and may take a form of a square matrix.

Accordingly, in the parity sub-matrix, 1 may exist from the first column of the first row to the last column of the last row in a diagonal direction, and 1 may also exist from the first column of the second row to a column immediately prior to the last column of the last row in a diagonal direction. In addition, the remaining elements of the parity sub-matrix may be 0.

Accordingly, the number of 1 which exists in each of all columns except the last column in the parity sub-matrix is two, and the number of 1 which exits on the last column is one.

Figure 3:
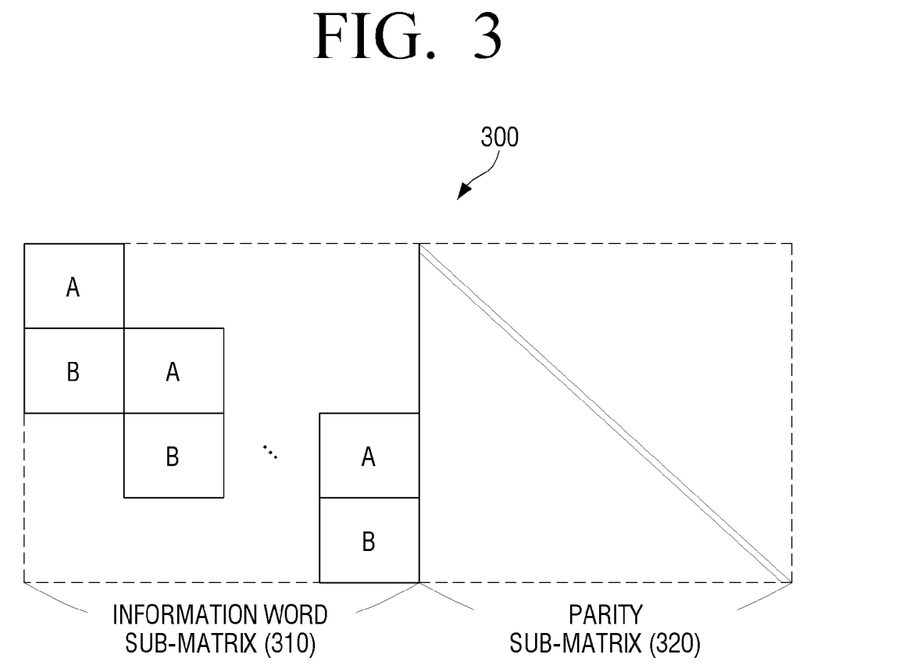
FIG. 3 is a diagram illustrating an example of a parity check matrix of an SC-LDPC code of which a parity sub-matrix has a dual diagonal structure.

FIG. 3 is a diagram illustrating an example of a parity check matrix for an SC-LDPC code having a dual diagonal structure. The parity check matrix having this structure may be used in Advanced Television Systems Committee (ATSC) standards which are currently being developed.

Meanwhile, when a parity check matrix is H, and a codeword is C, an LDPC encoding operation is a process of generating a codeword which satisfies $H \times C^T = 0$. Accordingly, each column of the parity check matrix corresponds to each bit of a codeword. Thus, a sub-matrix formed of columns which correspond to information word bits of a codeword in the parity check matrix is referred to as an information word sub-matrix, and a sub-matrix formed of columns which correspond to parity bits of the codeword may be referred to as a parity sub-matrix.

That is, a parity sub-matrix 300 of FIG. 3 is formed of an information word sub-matrix 310 and a parity sub-matrix 320.

In this case, the information word sub-matrix 310 may be formed of a plurality of sub-matrixes A and B which are repeatedly arranged while being shifted in a diagonal direction in the information word sub-matrix 310, and the parity sub-matrix 320 may have a dual diagonal structure, as described above.

As above, the dual diagonal structure of the parity sub-matrix may be referred to as an IRA structure.

Meanwhile, a method of performing an LDPC encoding operation based on the parity sub-matrix 300 having a structure as in FIG. 3 is described as below.

First, temporary parity bits are calculated with respect to each row of the parity check matrix 300. In this case, the temporary parity bits may be calculated based on the information word sub-matrix 310.

To be specific, an $i^{th}$ temporary parity bit $t_i$ may be obtained by adding information word bits corresponding to columns where 1 exists in the $i^{th}$ row of the information word matrix 310 by modulo-2 sum.

For example, when 1 exists in the first, fourth, and fifth columns of the $i^{th}$ row of the information word sub-matrix 310, the temporary parity bit $t_i$ may be calculated by $t_i = i_1 + i_4 + i_5$. In this case, $i_1$ refers to the first information word bit, $i_4$ refers to the fourth information word bit, $i_5$ refers to the fifth information word bit, and + refers to the modulo-2 sum operation.

Subsequently, the parity bits may be calculated finally by sequentially accumulating the generated temporary parity bits.

To be specific, by setting as $p_0 = t_0$ and incrementally increasing the i value starting from 1, the $i^{th}$ parity bit $p_i$ may be calculated as $p_i = p_{i-1} + t_i$. That is, the parity bits $p_0$, $p_1$, ... may be calculated in a manner such as '$p_1 = p_0 + t_1$, $p_2 = p_1 + t_2$, ....' In this case, + refers to the modulo-2 sum operation.

Figure 4:
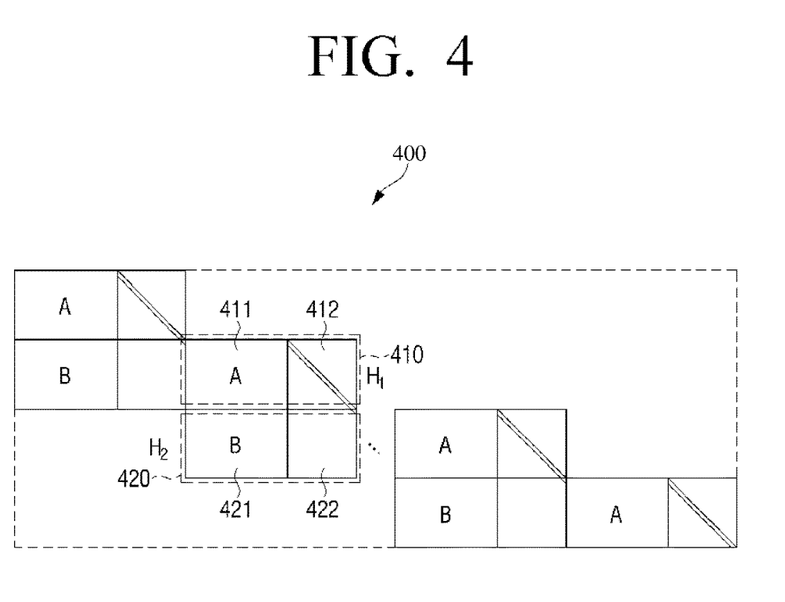
FIG. 4 is a diagram illustrating a structure of a parity check matrix generated by permuting a parity check matrix having a structure as in FIG. 3, according to an exemplary embodiment.

Meanwhile, if a column permutation with respect to the parity check matrix 300 having the structure as in FIG. 3 is performed, a parity check matrix 400 having a structure as in FIG. 4 may be generated. In this case, permuting columns in a matrix is switching locations of columns by which only locations of codeword bits are switched. Thus, the column permutation does not affect the characteristic of a code.

Referring to FIG. 4, in the parity check matrix 400, a new sub-matrix may be formed by combining one of a plurality of sub-matrixes constituting the parity check matrix 300 of FIG. 3 and a sub-matrix having a specific form, and the new sub-matrix may be repeatedly arranged while being shifted in a diagonal direction in the parity check matrix 400.

In this case, the sub-matrix having a specific form may have a dual diagonal structure or a structure in which the last column of the first row is 1 and the remaining elements are 0.

That is, as shown in FIG. 4, a sub-matrix $H_1$ 410 is formed of a sub-matrix A 411 and a sub-matrix 412 having a dual diagonal structure arranged on the immediate right of the sub-matrix A 411, and a sub-matrix $H_2$ 420 may be formed of a sub-matrix B 421 and a sub-matrix 422, in which the last column of the first row is 1 and the remaining elements are 0, arranged on the immediate right of the sub-matrix 421. In this case, the sub-matrix $H_2$ 420 is arranged immediately below the sub-matrix $H_1$ 410.

Accordingly, the parity check matrix 400 may be formed as the sub-matrixes $H_1$ 410 and $H_2$ 420 are arranged repeatedly in the diagonal direction in the parity check matrix 400.

Meanwhile, the parity check matrix 400 having the structure as in FIG. 4 is generated as columns of the parity check matrix 300 having the structure as in FIG. 3 are permuted. Thus, the sub-matrix A 411 and the sub-matrix B 421 of the parity check matrix 400 may be the matrixes which belonged to the information word sub-matrix 310, and the matrixes 412 and 422 having a specific form may be the matrixes which belonged to the parity sub-matrix 320.

Accordingly, hereinafter, the matrixes corresponding to the information word sub-matrix 310, such as the sub-matrix A 411 and the sub-matrix B 421, are referred to as an information word sub-matrix, and the matrixes corresponding to the parity sub-matrix 320, such as the matrixes having a specific form 412 and 422 are referred to as a parity sub-matrix.

In addition, when it is assumed that the information word bits corresponding to each of the information word sub-matrixes which are arranged immediately next to each other are sub-information word bits, a sequence of the sub-information word bits may be information word bits corresponding to the information word sub-matrix 310. Similarly, when it is assumed that parity bits corresponding to each of the parity sub-matrixes which are arranged immediately next to each other are sub-parity bits, a sequence of the sub-parity bits may be parity bits corresponding to the parity sub-matrix 320.

Accordingly, hereinafter, bits which are generated by each of the sub-matrixes formed of the information word sub-matrixes arranged immediately next to each other and the parity sub-matrixes arranged immediately next to each other, that is, a sub-matrix formed of the sub-matrix H1 410 and the sub-matrix H2 420, are referred to as a sub-codeword.

Meanwhile, in case of the parity check matrix having the structure as in FIG. 4, a sub-matrix in a specific form are arranged repeatedly while being shifted by a predetermined number of rows in a column direction. Thus, the parity check matrix in FIG. 4 may be the same structure as a parity check matrix for an SC-LDPC code. Accordingly, hereinafter, a code having the structure as in FIG. 4 is referred to as an SC-IRA code. The SC-IRA code may have an excellent characteristic of the SC-LDPC code and an encoding characteristic of the low complexity of an IRA code.

Meanwhile, in FIG. 4, the parity check matrix is formed of two sub-matrixes, that is, the matrix $H_1$ and the matrix $H_2$ are arranged repeatedly, but this is merely an example. That is, a parity check matrix used for an SC-IRA code may have a form where two or more sub-matrixes are arranged repeatedly while being shifted by a predetermined number of rows in a column direction.

Meanwhile, the encoder 110 may perform an LDPC encoding operation based on the parity check matrix having the structure as in FIG. 4.

Hereinafter, a method that the encoder 110 performs an LDPC encoding operation based on a parity check matrix having the structure as in FIG. 4 is described with reference to FIGS. 5 to 8.

In case of an LDPC encoding operation with respect to each of a plurality of blocks formed of a first information word sub-matrix and a first parity sub-matrix arranged on the immediate right of the first information word sub-matrix and a second information sub-matrix and a second parity sub-matrix arranged on the immediate right of the second information sub-matrix, the encoder 110 may perform an LDPC encoding operation by changing an element of the second parity sub-matrix. In this case, the first parity sub-matrix may be a sub-matrix having a dual diagonal structure, and the second parity sub-matrix may be a sub-matrix in which the last column of the first row is 1 and the remaining elements are 0.

Figure 5:
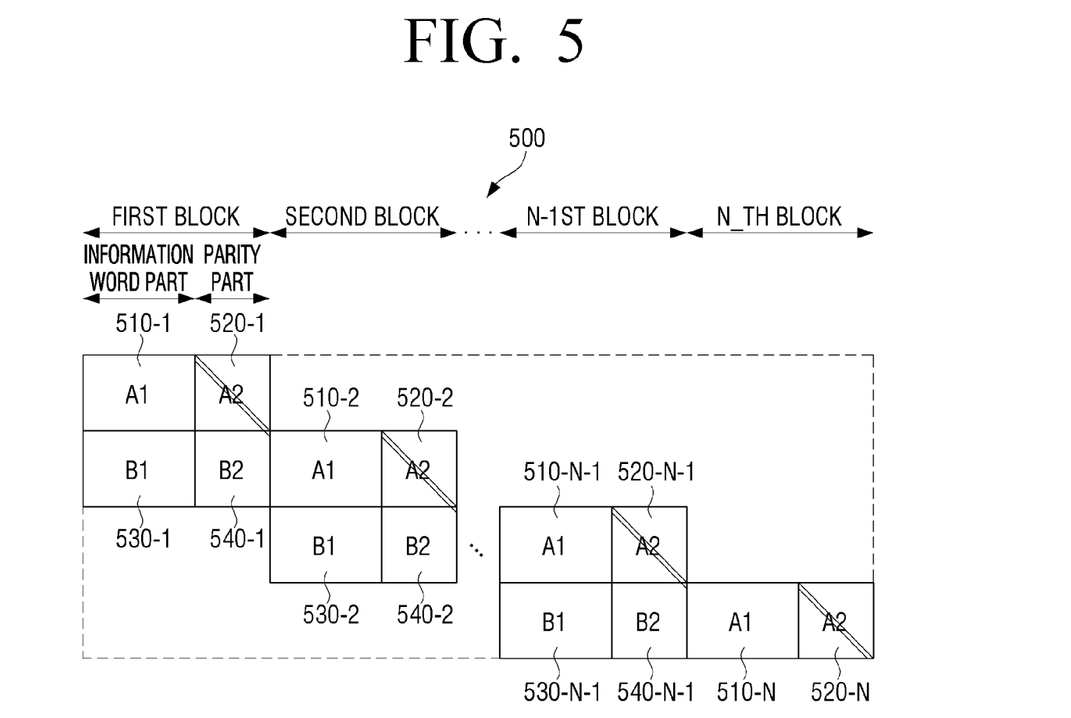
FIGS. 5 to 8 are diagrams provided to describe an encoding method according to an exemplary embodiment.

That is, FIG. 5 illustrates that a parity check matrix 500 includes a first information first sub-matrix A1, a first parity sub-matrix A2 which is arranged on the immediate right of the first information word sub-matrix A1, a second information word sub-matrix B1, and a second parity sub-matrix B2 which is arranged on the immediate right of the second information word sub-matrix B1. In this case, a sub-matrix where the first information word sub-matrix A1 and the first parity sub-matrix A2 are combined and a sub-matrix where the second information sub-matrix B1 and the second parity sub-matrix B2 are combined may be arranged repeatedly while being shifted by a predetermined number of rows in a column direction.

Herein, the first parity sub-matrix A2 may be a sub-matrix having a dual diagonal structure, and the second parity sub-matrix B2 may be a sub-matrix in which the last column of the first row is 1 and the remaining elements are 0.

In this case, the parity check matrix 500 may be divided into a plurality of blocks in a sub-codeword unit.

That is, in the parity check matrix 500, a sub-matrix, in which first and second information word sub-matrixes A1 510-1 and B1 530-1 are arranged immediately next to each other in a column direction and first and second parity first sub-matrixes A2 520-1 and B2 540-1 arranged immediately next to each other in the column direction are combined, may correspond to a first block, a sub-matrix, in which first and second information word sub-matrixes A1 510-2 and B1 530-2 are arranged immediately next to each other in the column direction and first and second parity sub-matrixes A2 520-2 and B2 540-2 arranged immediately next to each other in the column direction are combined, may correspond to a second block, . . . a sub-matrix, in which first and second information word sub-matrixes A1 510-N−1 and B1 530-N−1 arranged immediately next to each other in the column direction and the first and second parity sub-matrixes A2 520-N−1 and B2 540-N−1 arranged immediately next to each other in the column direction are combined, may correspond to an $(N-1)^{th}$ block, and a sub-matrix, in which an information word sub-matrix A1 510-N and a parity sub-matrix A2 520-N are combined, may correspond to an $N^{th}$ block.

In this case, the encoder 110 may generate a plurality of sub codewords by performing LDPC encoding operations with respect to the plurality of blocks in parallel.

For the above operation, the encoder 110 may perform an LDPC encoding operation with respect to each of a plurality of blocks by changing an element of the last column of the first row of each of the second parity sub-matrixes to 0.

Herein, the second parity sub-matrix has a structure having the first row where 1 exists in the last column and 0 exists in the other columns of the first row. Thus, if the last column of the first row of the second parity sub-matrix is set to 0, the second parity sub-matrix becomes a zero sub-matrix.

Figure 6:
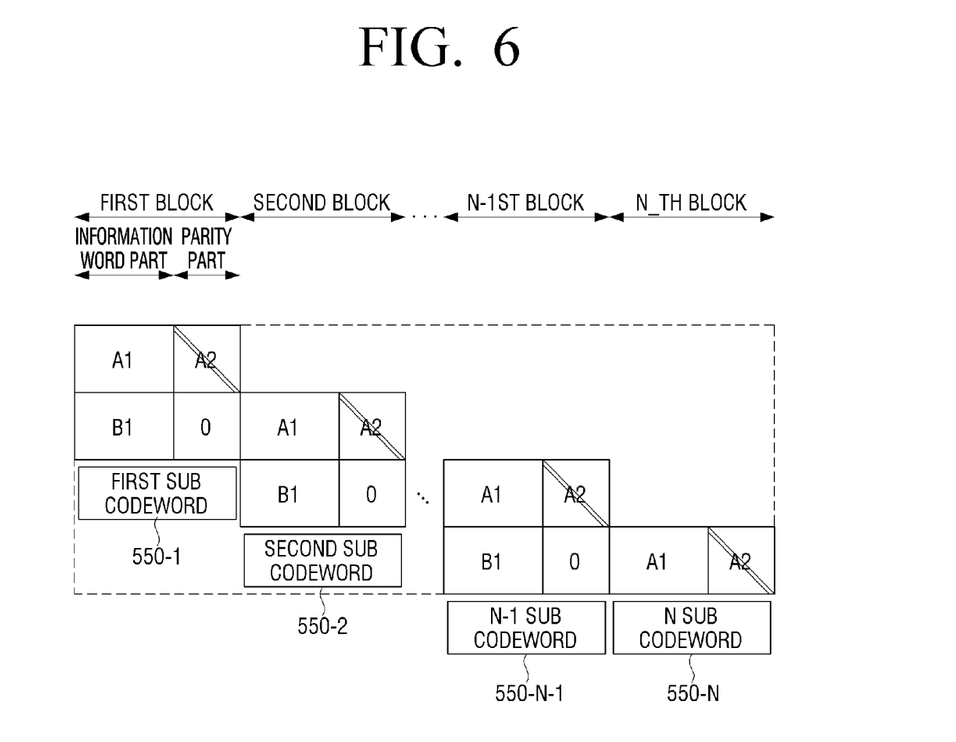

That is, as shown in FIG. 6, the encoder 110 may assume that each of the second parity matrixes B2 is a zero (0) sub-matrix and perform an LDPC encoding operation with respect to each block.

Accordingly, the encoder 110 may generate a first sub codeword 550-1 by performing an LDPC encoding operation with respect to the first block, generate a second sub codeword 550-2 by performing an LDPC encoding operation with respect to the second block, . . . , generate an $(N-1)^{th}$ sub codeword 550-N−1 by performing an LDPC encoding operation with respect to the $(N-1)^{th}$ block, and generate an $N^{th}$ sub codeword 550-N based on the $N^{th}$ block.

As above, when an encoding operation is performed using a zero parity sub-matrix (B2), a parity bit part of a $t^{th}$ block does not affect an encoding operation with respect to a $(t+1)^{th}$ block. Thus, the encoding operation with respect to the $(t+1)^{th}$ block may be performed independently even though the encoding operation with respect to the $t^{th}$ block has not been performed. Accordingly, encoding operations with respect to the plurality of blocks may be performed in parallel.

The bit determiner 120 determines a bit value of the last parity bit among parity bits generated by an LDPC encoding operation with respect to one of a plurality of blocks.

To be specific, the bit determiner 120 determines whether a bit value of the last bit among parity bits generated by the LDPC encoding operation with respect to the first block among the plurality of blocks, that is, the last bit among the first parity bits is 0 or 1. That is, the bit determiner 120 determines whether a bit value of the last sub parity bit among the first sub parity bits of the first sub-codeword 550-1 shown in FIG. 6 is 0 or 1.

The bit modifier 130 reverses bit values of bits generated by an LDPC encoding operation with respect to a next block, based on the bit value of the last parity bit among parity bits of a current block. Herein, reversing a bit value refers to changing 0 to 1 and 1 to 0.

To be specific, in response to a bit value of the last parity bit among the parity bits generated by the LDPC encoding operation with respect to one of the plurality of blocks being 1, the bit modifier 130 reverses the bits generated by the LDPC encoding operation with respect to the next block.

First, in response to a bit value of the last parity bit among the parity bits generated by the LDPC encoding operation with respect to a first block of the plurality of blocks being 1, the bit modifier 130 may reverse the parity bits generated by the LDPC encoding operation with respect to the second block.

Figure 7:
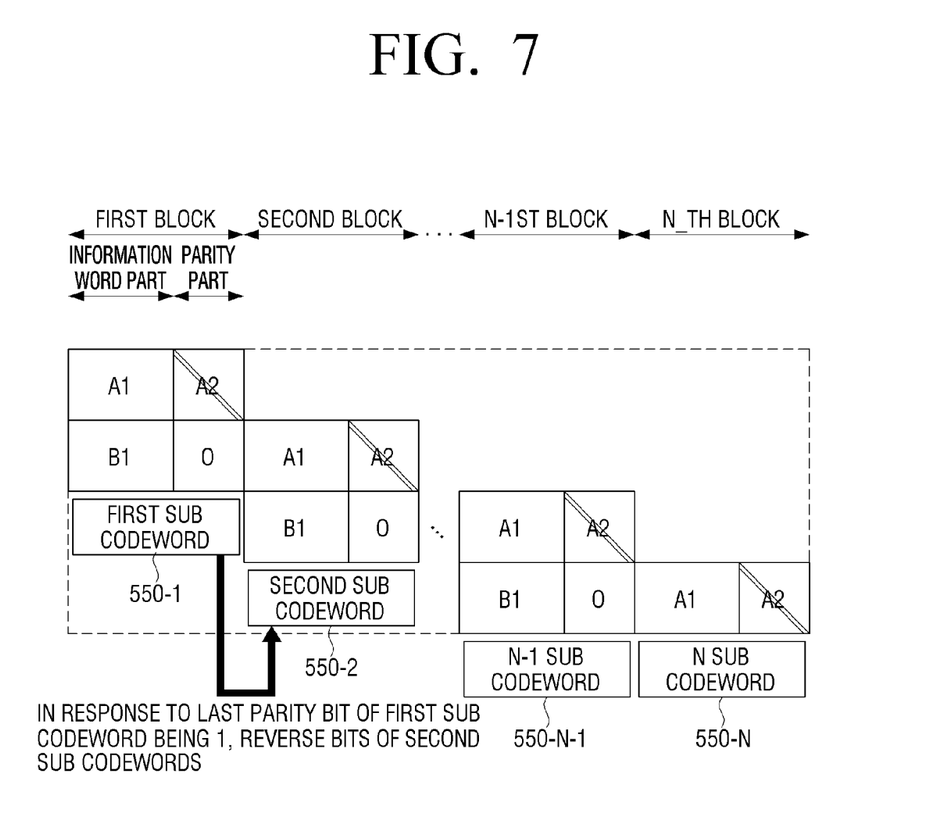

For example, in response to a bit value of the last sub-parity bit among the first sub-parity bits of the first sub-codeword 550-1 being 1 as shown in FIG. 7, the bit modifier 130 may reverse the bits constituting a second sub-codeword. For example, in case of the second sub-codeword formed of 00110 . . . 0110, the second sub-codeword becomes 11001 . . . 1001 by the reversing operation.

Such reversing operation is performed since an LDPC encoding operation is performed under assumption that a second parity sub-matrix, where 1 exists in the last column of the first row and the other columns have 0 in the first row, is a zero sub-matrix, in order to perform the LDPC encoding operations with respect to a plurality of blocks in parallel.

Meanwhile, after the reversing operation with respect to the sub-codeword bits of the next block is performed based on the bit value of the last sub-parity bit of the first block, the bit determiner 120 determines a bit value of the last parity bit among parity bits generated by the LDPC encoding operation with respect to the next block.

That is, as described above, in response to a bit value of the last parity bit among the parity bits generated by the LDPC encoding operation with respect to the first block among a plurality of blocks being 0, the bit modifier 130 does not reverse the bits generated by the LDPC encoding operation with respect to the second block, but in response to a bit value of the last parity bit among the parity bits generated by the LDPC encoding operation with respect to the first block being 1, the bit modifier 130 reverses the bits generated by an LDPC encoding operation with respect to a second block.

As above, after an operation of reversing or maintaining the bits generated by the second block by the bit value of the last parity bit among the parity bits generated by the LDPC encoding operation with respect to the first block is performed, the bit determining unit 120 determines a bit value of the last parity bit among the parity bits generated by the LDPC encoding operation with respect to the second block.

For example, the bit determiner 120 determines whether a bit value of the last sub-parity bit among the second sub-parity bits of the second sub-codeword 550-2 as shown in FIG. 7 is 0 or 1. In the aforementioned example, the second sub-codeword 550-2 becomes 11001 . . . 1001 by the reversing operation. In this regard, the bit value of the last sub-parity bit may be 1.

Subsequently, the bit modifier 130 may reverse bit values of the bits generated by an LDPC encoding operation with respect to a block after the next block, based on the bit value of the last parity bit.

That is, the bit modifier 130 may reverse bit values of the bits generated by an LDPC encoding operation with respect to a third block, based on the bit value of the last parity bit among the parity bits generated by the LDPC encoding operation with respect to the second block among the plurality of blocks.

Figure 8:
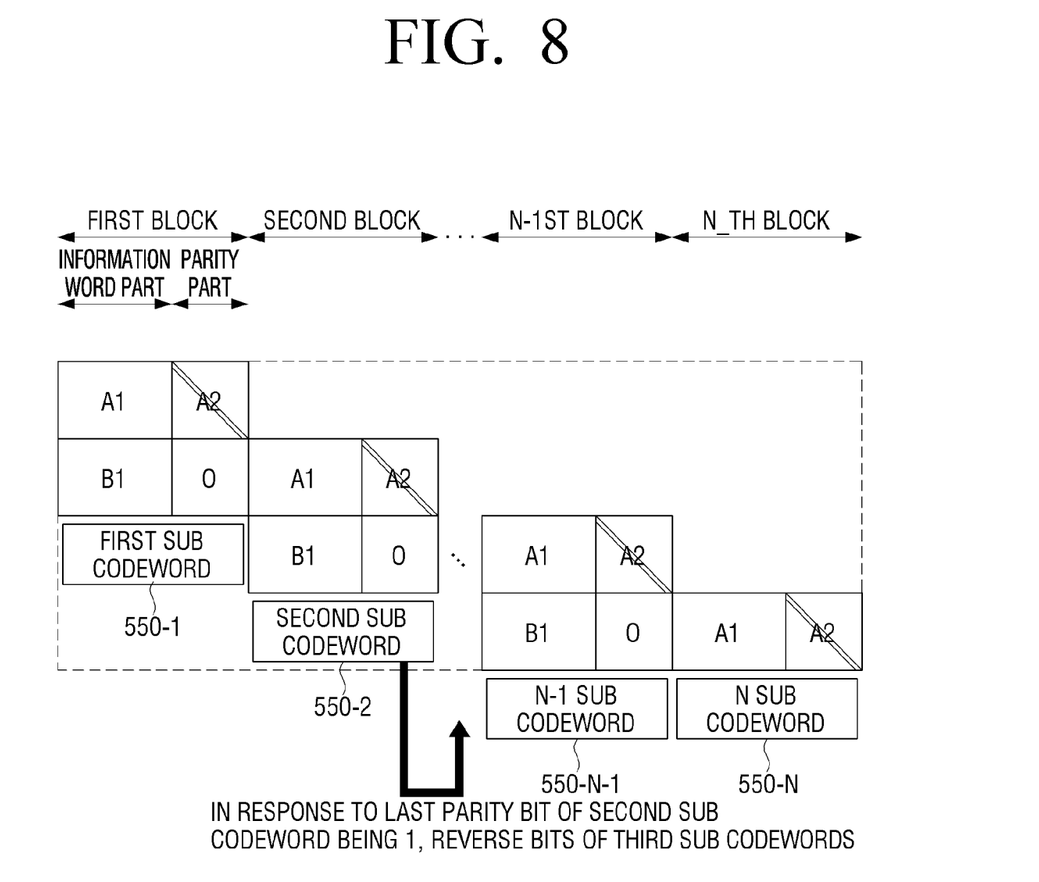

For example, in response to a bit value of the last parity bit among the second sub-parity bits of the second sub-codeword 550-2 being 1 as shown in FIG. 8, the bit modifier 130 may reverse the bits constituting a third sub-codeword. In the aforementioned example, the bit value of the last sub-parity bit of the second sub-codeword 550-2 is changed to 1 by the reversing operation, and thus, the bit modifier 130 may reverse the bits constituting the third sub-codeword.

Meanwhile, the bit determiner 120 and the bit modifier may repeat the aforementioned operations with respect to the other blocks.

That is, the bit determiner 120 may determine a bit value of the last parity bit among parity bits generated by an LDPC encoding operation with respect to a $t^{th}$ block, and the bit modifier 130 may reverse the bits generated by an LDPC encoding operation with respect to a $(t+1)^{th}$ block based on the bit value of the corresponding last parity bit.

Upon completion of the aforementioned operation with respect to the last block, a codeword may be generated finally. That is, a list of sub codewords generated, after the reversing operations with respect to the bits corresponding to all of the other blocks except the first block are performed, may be a codeword which is generated based on the parity check matrix of an SC-IRA code.

That is, the encoding apparatus 100 may sequentially arrange and output the bits constituting each of the first sub-codeword, the second sub-codeword, . . . , an $(N-1)^{th}$ sub-codeword, and an $N^{th}$ sub-codeword after the reversing operations with respect to the bits corresponding to all of the blocks except the first block are performed sequentially. Accordingly, the bits output from the encoding apparatus 100 may be a codeword which is generated based on the parity check matrix of the SC-IRA code.

Figure 9:
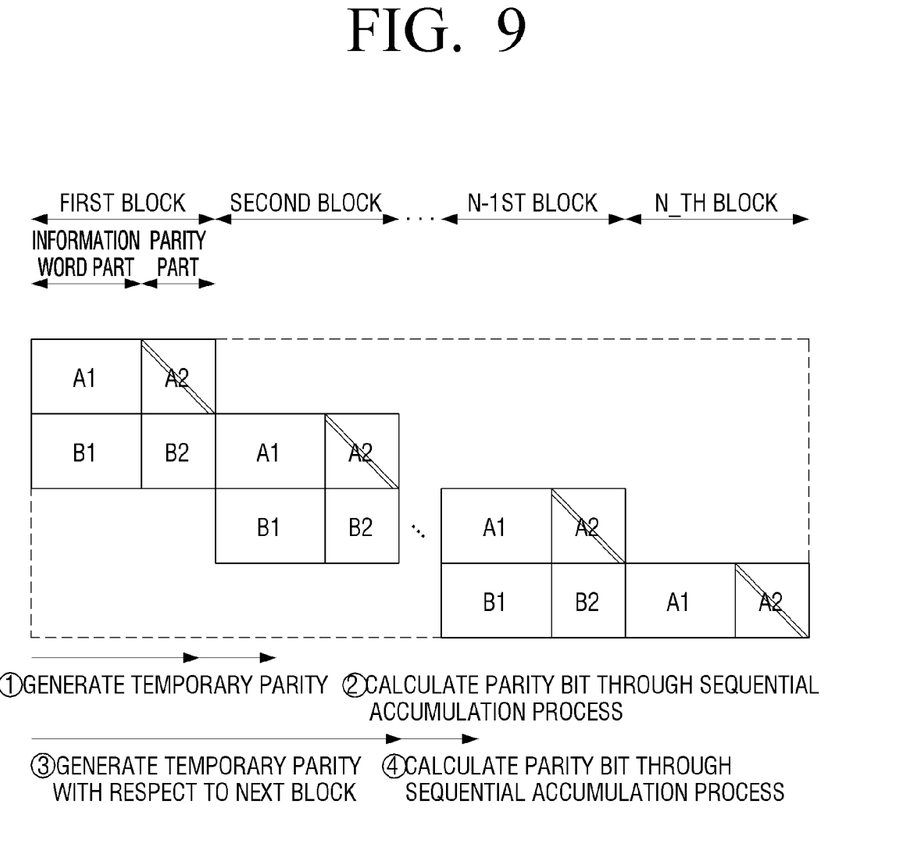
FIGS. 9 to 10 are diagrams provided to describe an effect of an encoding method according to an exemplary embodiment.
Figure 10:
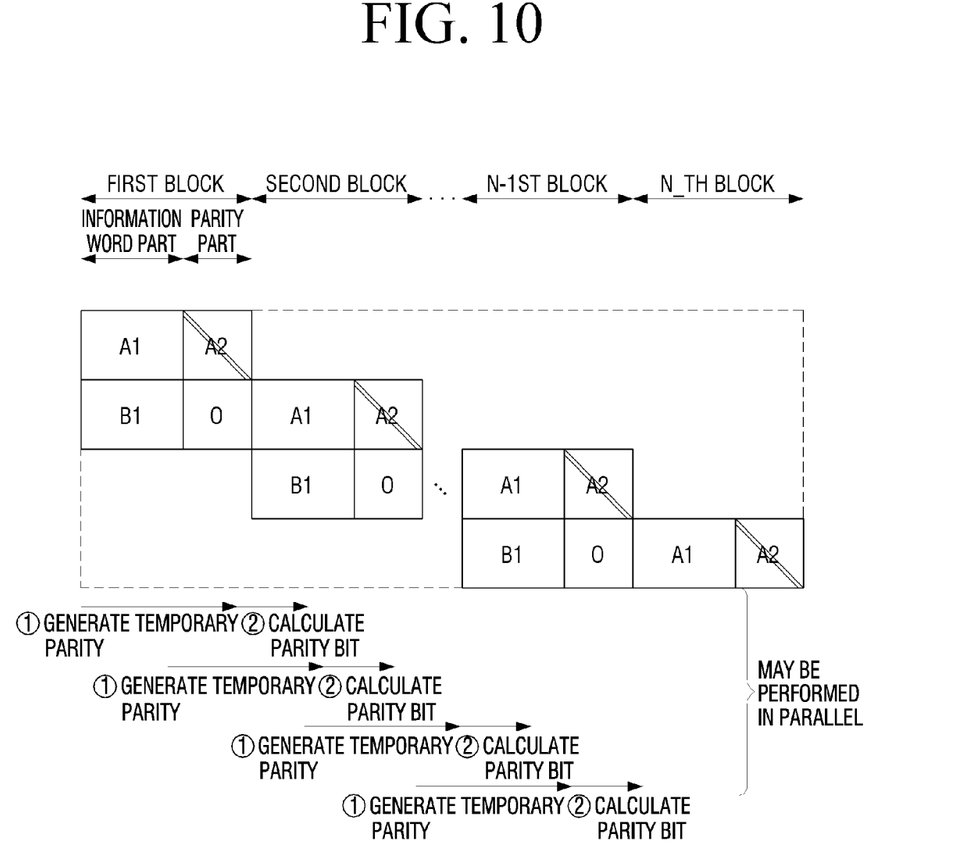

FIGS. 9 to 10 are diagrams provided to describe an effect of an encoding method according to an exemplary embodiment.

FIG. 9 is a diagram provided to describe an existing encoding method of an SC-IRA code, and FIG. 10 is a drawing provided to describe an encoding method of an SC-IRA code according to an exemplary embodiment.

Referring to FIG. 9, in the existing encoding method, an encoding operation with respect to each block of a parity check matrix is performed sequentially. That is, in order to perform an encoding operation for a $(t+1)^{th}$ block, an encoding result of a $t^{th}$ block should be obtained first since only one 1 exits on a parity sub-matrix of the $(t+1)^{th}$ block. Accordingly, the $t^{th}$ block and the $(t+1)^{th}$ block are connected to each other, and an encoding operation with respect to each block may not be performed independently.

That is, as shown in FIG. 9, ① temporary parity bits are generated with respect to the first block, and ② a parity bit is calculated through a sequential accumulation process. However, in an encoding operation with respect to the second block, the second block is connected to the first block. In this regard, ③ temporary parity bits are generated with respect to the first block and the second block, and ④ a parity bit is calculated through the sequential accumulation process.

However, referring to FIG. 10, an encoding operation with respect to each block is performed under an assumption that a parity sub-matrix is a zero (0) sub-matrix, and thus, a parity bit part of the $t^{th}$ block does not affect an encoding operation with respect to the $(t+1)^{th}$ block. That is, even though the encoding operation with respect to the $t^{th}$ block has not been performed, an encoding operation with respect to the $(t+1)^{th}$ block may be performed.

That is, as shown in FIG. 10, with respect to each block, ① the temporary parity bits are generated, ② the parity bit is calculated through the sequential accumulation process, and thus, a sub-codeword may be generated.

As above, herein, the encoding operations with respect to a plurality of blocks may be performed in parallel. Accordingly, in case of a parity check matrix formed of N number of blocks, the existing encoding method requires a time a×N, whereas the present exemplary embodiment may complete the encoding operations within a time a. That is, the encoding operations with respect to the plurality of blocks may be performed independently at the same time.

In addition, as described above, a plurality of sub-codewords are generated in parallel, and then a reversing operation is performed by considering 1 of a parity sub-matrix, which was considered as 0. For example, in response to a bit value of the last sub-codeword of the $t^{th}$ block being 1, the entire sub-codeword bits of the $(t+1)^{th}$ block are reversed.

In this case, whether to reverse the sub-codeword bits of the $(t+1)^{th}$ block is determined after the reversing operation of the $t^{th}$ block is determined, but the reversing operation may be performed in a very short time within a few clock cycles, according to implementation of hardware. In this regard, a reversing operation with respect to all sub-codewords may be also performed in a very short time.

In this case, when it is assumed that a time required in the reversing operation is c, a time required in the encoding operation of the present exemplary embodiment may be a+c. Herein, c is a value which is far shorter than a, and the time required in the encoding operation of the present exemplary embodiment is a+c. Thus, both values may be represented by a+c<a×N. Accordingly, a time of a×N−(a+c) may be shortened.

Figure 11:
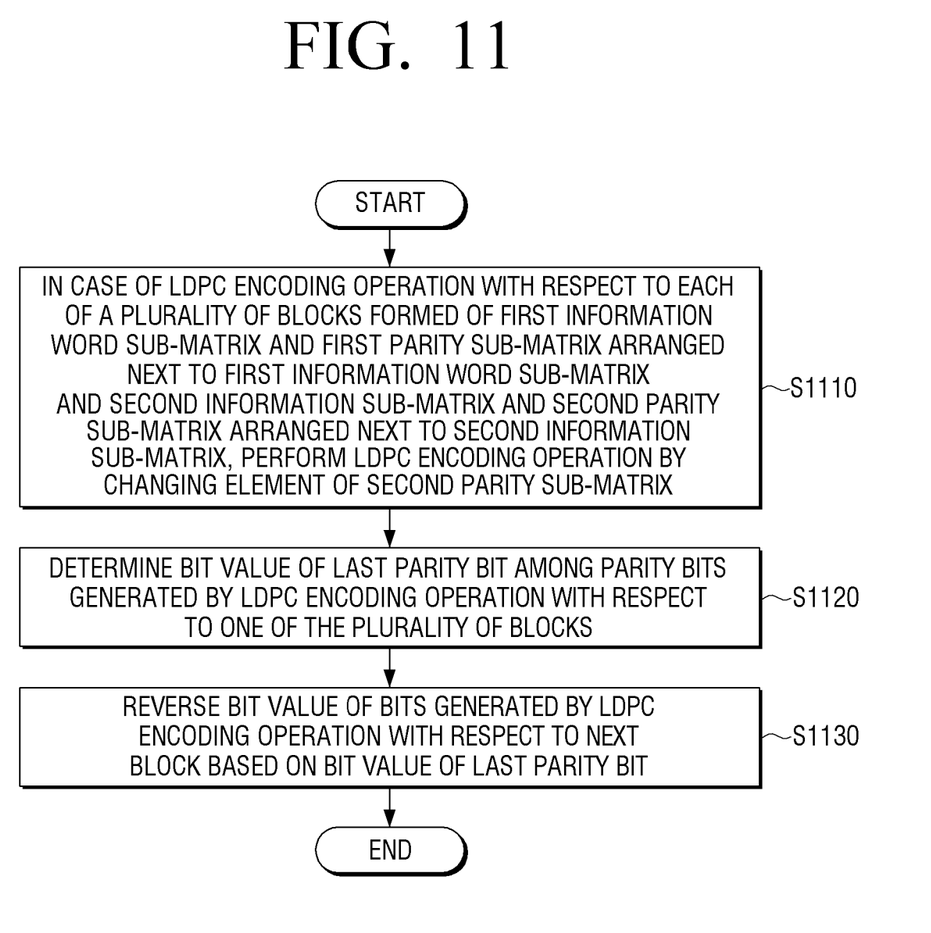
FIG. 11 is a flowchart provided to describe an encoding method according to an exemplary embodiment.

FIG. 11 is a flowchart provided to describe an encoding method according to an exemplary embodiment.

In case of an LDPC encoding operation with respect to each of a plurality of blocks formed of a first information word sub-matrix and a first parity sub-matrix arranged on the immediate right of the first information word sub-matrix and a second information sub-matrix and a second parity sub-matrix arranged on the immediate right of the second information sub-matrix, an LDPC encoding operation is performed by changing an element of the second parity sub-matrix (S1110). Here, the first and second information word sub-matrixes are arranged next to each other in a column direction, and the first and second parity sub-matrixes are also arranged next to each other in the column direction.

In this case, the first parity sub-matrix may be a sub-matrix having a dual diagonal structure, and the second parity sub-matrix may be a sub-matrix having a first row where 1 exists on a last column and 0 exists on the other columns of the first row.

To be specific, the LDPC encoding operation with respect to each of the plurality of blocks may be performed by changing an element of a last column of the first row of the parity second sub-matrix to 0.

Subsequently, a bit value of the last parity bit among parity bits generated by an LDPC encoding operation with respect to one of the plurality of blocks is determined (S1120).

In addition, a bit value of bits generated by the LDPC encoding operation with respect to a next block is reversed based on the bit value of the last parity bit (S1130).

In this case, in response to the last parity bit among the parity bits generated by the LDPC encoding operation with respect to one of the plurality of blocks being 1, the bits generated by the LDPC encoding operation with respect to the next block may be reversed.

In S1120, a bit value of the last parity bit among the parity bits generated by the LDPC encoding operation with respect to the next block after a reversing operation with respect to the parity bits of the next block is performed is determined based on the bit value of the last parity bit. In S1130, a bit value of the bits generated by the LDPC encoding operation with respect to a block after the next block may be reversed based on the bit value of the last parity bit.

Meanwhile, a specific method of performing an encoding operation of a plurality of blocks in parallel has been described above.

Meanwhile, a non-transitory computer readable medium including a program which sequentially performs the encoding methods according to the exemplary embodiments may be provided.

The non-transitory computer readable medium refers to a medium which may store data semi-permanently rather than storing data for a short time such as a register, a cache, and a memory and may be readable by an apparatus. Specifically, the above-described various applications and programs may be stored in the non-transitory computer readable medium like a compact disc (CD), a digital versatile disk (DVD), a hard disk, a Blu-ray disk, a universal serial bus (USB), a memory card, and a read-only memory (ROM), etc., and provided therein.

At least one of the components, elements or units represented by a block as illustrated in FIG. 1 may be embodied as various numbers of hardware, software and/or firmware structures that execute respective functions described above, according to an exemplary embodiment. For example, at least one of these components, elements or units may use a direct circuit structure, such as a memory, processing, logic, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions. Also, at least one of these components, elements or units may further include a processor such as a central processing unit (CPU) that performs the respective functions, a microprocessor, or the like. Further, although a bus is not illustrated in the above block diagrams, communication between the components, elements or units may be performed through the bus.

According to another exemplary embodiment, a decoding apparatus, which includes components, elements or units corresponding to the encoder 110, the bit determiner 120 and the bit modifier 130 of the encoding apparatus 100 as shown in FIG. 1, may receive and process a signal which is generated by the encoding apparatus 100. These components, elements or units may perform respective operations corresponding to those of the encoder 110, the bit determiner 120 and the bit modifier 130 of the encoding apparatus 100. Thus, detailed descriptions thereof are omitted herein.

Also, according to another exemplary embodiment, the above encoding and decoding operations may be performed in other types of encoding and decoding than the LDPC encoding and decoding.

As given above, although a few exemplary embodiments have been shown and described, the inventive concept is not limited to the aforementioned exemplary embodiments, and could be variously modified and achieved by those skilled in the art to which these exemplary embodiment pertain without deviating from the substance of the inventive concept which is claimed in the claims, and such modifications should not be understood separately from the inventive concept.

What is claimed is:

1. An encoding apparatus comprising at least one processor to implement:
    an encoder configured to encode input bits to generate a first sub-codeword based on a first block included in a parity check matrix and generate a second sub-codeword based on a second block included in the parity check matrix, the second block being arranged by shifting the first block by a predetermined number of rows in a column direction in the parity check matrix;
    a bit determiner configured to determine a value of a last parity bit of the first sub-codeword; and
    a bit modifier configured to, if the last parity bit of the first sub-codeword is 1, reverse bits of the second sub-codeword,
    wherein the encoder is configured to, if the last parity bit of the first sub-codeword is 0, generate a codeword corresponding to the parity check matrix using the first sub-codeword and the second sub-codeword, and if the last parity bit of the first sub-codeword is 1, generate a codeword corresponding to the parity check matrix using the first sub-codeword and the second sub-codeword of which the bits are reversed.

2. The apparatus of claim 1, wherein the first block comprises a first information sub-matrix and a first parity sub-matrix which has a dual diagonal structure, and wherein the second block comprises a second information sub-matrix and a second parity sub-matrix which has a first row in which 1 exists in a last column and 0 exists in the other columns.

3. The apparatus of claim 2, wherein the encoder is configured to change a value of the last column of the first row of the second parity sub-matrix to 0.

4. The apparatus of claim 1, wherein the encoder is configured to generate a third sub-codeword based on a third block included in the parity check matrix, the third block being arranged by shifting the second block by the predetermined number of rows in the column direction in the parity check matrix.

5. The apparatus of claim 4, wherein the bit determiner is configured to, if the last parity bit of the first sub-codeword is 0, determine a last parity bit of the second sub-codeword, and if the last parity bit of the first sub-codeword is 1, determine a last parity bit of the reversed second sub-codeword, and wherein the bit modifier is configured to, if the last parity bit of the second sub-codeword is 1, reverse bits of the third sub-codeword, and wherein the encoder is configured to, if the last parity bit of the second sub-codeword is 0, generate a codeword corresponding to the parity check matrix based on the third sub-codeword, and if the last parity bit of the first sub-codeword is 1, generate a codeword corresponding to the parity check matrix based on the third sub-codeword of which the bits are reversed.

6. An encoding method implemented by at least on processor, the method comprising:

encoding input bits to generating a first sub-codeword based on a first block included in a parity check matrix and generate a second sub-codeword based on a second block included in the parity check matrix, the second block being arranged by shifting the first block by a predetermined number of rows in a column direction in the parity check matrix;

determining a value of a last parity bit of the first sub-codeword; and if the last parity bit of the first sub-codeword is 1, reversing bits if the second sub-codeword, wherein if the last parity bit of the first sub-codeword is 0, the encoding comprises generating a codeword corresponding to the parity check matrix using the first sub-codeword and the second sub-codeword, and if the last parity bit of the first sub-codeword is 1, the encoding comprises generating a codeword corresponding to the parity check matrix using the first sub-codeword and the second sub-codeword of which the bits are reversed.

7. The method of claim 6, wherein the first block comprises a first information sub-matrix and a first parity sub-matrix which has a dual diagonal structure, and wherein the second block comprises a second information sub-matrix and a second parity sub-matrix which has a first row in which 1 exists in a last column and 0 exists in the other columns.

8. The method of claim 7, wherein the value of the element of the second parity sub-matrix is changed by changing a value of the last column of the first row of the second parity sub-matrix to 0.

9. The method of claim 6, wherein the encoding comprises generating a third sub-codeword based on a third block included in a parity check matrix, the third block being arranged by shifting the second block by the predetermined number of rows in the column direction in the parity check matrix.

10. The method of claim 9, further comprising:

if the last parity bit of the first sub-codeword is 0, determining a last parity bit of the second sub-codeword, and if the last parity bit of the first sub-codeword is 1, determining a last parity bit of the reversed second sub-codeword; and if the last parity bit of the second sub-codeword is 1, reversing bits of the third sub-codeword, wherein, if the last parity bit of the second sub-codeword is 0, the encoding generates a codeword corresponding to the parity check matrix based on the third sub-codeword, and if the last parity bit of the first sub-codeword is 1, the encoding generates a codeword corresponding to the parity check matrix based on the third sub-codeword of which the bits are reversed.

* * * * *